United States Patent

[11] 3,594,619

[72] Inventors Mototaka Kamoshida; Takashi Okada, both of Tokyo, Japan

[21] Appl. No. 762,490
[22] Filed Sept. 25, 1968
[45] Patented July 20, 1971
[73] Assignee Nippon Electric Company, Limited Tokyo, Japan
[32] Priority Sept. 30, 1967
[33] Japan
[31] 42/62975

[54] FACE-BONDED SEMICONDUCTOR DEVICE HAVING IMPROVED HEAT DISSIPATION
2 Claims, 9 Drawing Figs.

[52] U.S. Cl. .... 317/234, 317/235, 29/585
[51] Int. Cl. .... H01l 1/12, H01l 1/14
[50] Field of Search .... 317/234, 235

[56] References Cited

UNITED STATES PATENTS

| | | | |
|---|---|---|---|
| 3,470,611 | 10/1969 | McIver et al. | 29/590 |
| 3,458,925 | 8/1969 | Napier et al. | 29/578 |
| 3,390,308 | 6/1968 | Marley | 317/100 |
| 3,388,301 | 6/1968 | James | 317/234 |
| 2,980,860 | 4/1961 | MacDonald | 330/6 |
| 3,414,775 | 12/1968 | Melan et al. | 317/100 |
| 3,271,634 | 9/1966 | Heaton | 317/234 |
| 3,283,224 | 11/1960 | Erkan | 317/234 |
| 3,400,311 | 9/1968 | Dahlberg et al. | 317/235 |

*Primary Examiner*—John W. Huckert
*Assistant Examiner*—B. Estrin
*Attorney*—Hopgood and Calimafde

ABSTRACT: A semiconductor device is described of the face bond type wherein beam leads in electrical contact with a semiconductor circuit located in a semiconductor pellet with a pellet region located between the circuit and an edge of the pellet outwardly project in cantilever fashion from the pellet edge. Special heat-conducting contacts are formed in between the beam leads in the pellet region to provide an improved heat-dissipating device.

PATENTED JUL 20 1971 3,594,619

INVENTORS
MOTOTAKA KAMOSHIDA
TAKASI OKADA

BY

Hopgood & Calimafde
ATTORNEYS

FACE-BONDED SEMICONDUCTOR DEVICE HAVING IMPROVED HEAT DISSIPATION

This invention relates to a semiconductor element fabricated by the so-called face bond technique, and more specifically to a semiconductor element of the face bond type (hereinafter referred to as a face bond element) so constructed as to attain an improved efficiency of heat dissipation.

Conventional face bond elements have high reliability and accessibility to automatization of the fabrication process, as described in the Bell System Technical Journal Vol. 45, p. 233, or Electronics p77, Jan. 24, 1966.

Such elements can be easily connected to thin or thick film circuit boards, and have many other advantages as compared with ordinary semiconductor elements. On the other hand, there are various disadvantages in such devices. Particularly, since the heat generated in the elements is dissipated only through the outlet connections of the electrodes, the conventional face bond elements have poor heat dissipation efficiency.

The present invention provides a face bond element capable of improving the heat dissipation efficiency.

The low dissipation efficiency of the conventional face bond elements can be mainly attributed to the fact that the heat generated is allowed to escape only through the leads extending beyond the edges of the semiconductor pellet and the fact that the bonding area between the leads and metallized pattern formed on the substrate or the case provided for supporting that pellet is quite small compared with the mounting area of the conventional wire bond-type element. In case of the bond-type element, the entire back side of the pellet is in close contact with the substrate. On the face bond element according to the present invention, the semiconductor pellet has a conductor layer on its surface, isolated from the circuit connections and of circuit elements thereon, which provides thermal contact between the semiconductor pellet and the substrate. In the structure of this invention, the heat generated in the face bond element is dissipated through thermal contacts into the supporter or the case. The thermal contact area is made as extensive as possible to enhance the heat dissipation efficiency. If necessary, beam leads may be led out of the heat-dissipating contacts, too, for connection with a radiator, so that the heat dissipation efficiency is further improved.

Now an embodiment of the present invention will be described in conjunction with the accompanying drawings wherein:

FIG. 1 is a plan view showing an embodiment of the invention; and

FIGS. 2A, B and C are cross-sectional views of a pellet of the semiconductor device of the invention in progressive stages of construction;

Figure 2A:
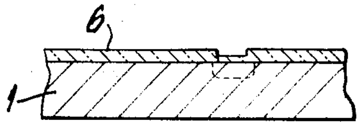
FIG. 2D is a cross-sectional view of a semiconductor element of the invention illustrating the heat-conducting and electrical lead thereon rising to a common plane.
FIG. 2E is a cross-sectional view of a semiconductor element of the invention illustrating the heat-conducting lead thereon rising above the electrical lead.
FIG. 2F is a cross-sectional view of a semiconductor device of the invention illustrating a semiconductor element of the invention having beam electrical leads face bonded to a substrate a raised electrical terminal thereon.
Figure 2E:
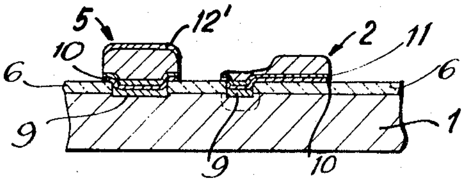
Figure 2B:
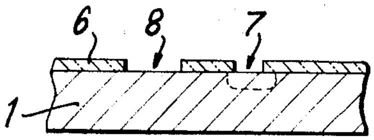
Figure 2F:
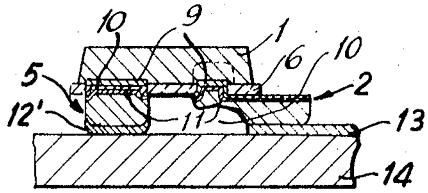
Figure 2C:
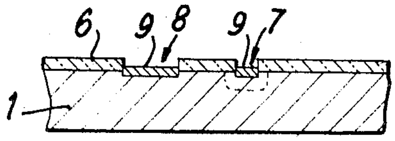
Figure 2F:
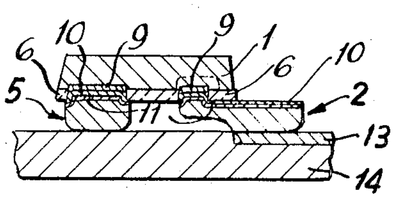
Figure 2D:
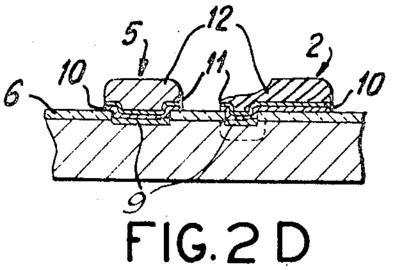
Figure 2G:
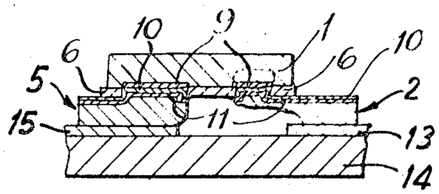

FIG. 2F′ is a cross-sectional view of a semiconductor device of the invention illustrating a semiconductor element of the invention having beam electrical leads face bonded to a substrate having an electrical terminal embedder therein; and FIG. 2G is a cross-sectional view of a semiconductor device of the invention having beam thermal and electrical leads face bonded to a substrate having raised thermal and electrical terminals thereon.

Figure 1:
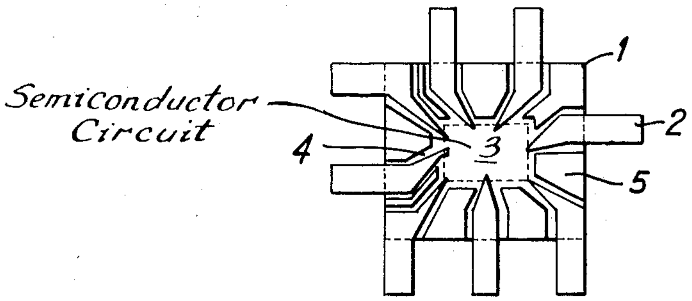

FIG. 1 is a plan view of a beam lead face bond element for an integrated circuit which represents a preferred embodiment of the invention. The element is formed of a semiconductor pellet 1 and beam leads 2 which extend outwardly therefrom in a cantilevered fashion. The semiconductor pellet 1 consists of a central region 3 (enclosed by dotted lines) which contains a semiconductor circuit having the usual circuit components such as active and passive elements and input and output electrodes (not shown in the drawing) which are selectively connected to beam leads 2 thereof and a marginal region 4 surrounding central region 3 which is large enough to ensure the bonding between the pellet 1 and the beam leads 2. Further, according to the invention, contacts 5 for heat dissipation are formed at the portions of the marginal region 4 where there are no beam leads 2 nor circuit elements of the semiconductor circuit. The contacts 5 therefore do not affect the semiconductor circuit elements. The contacts 5 can be formed simultaneously with the beam leads 2, and the combined area of the contacts is as large as possible provided that it does not cause any trouble electrically, thereby achieving a high efficiency of heat dissipation. When the beam lead element of the invention is mounted on a suitable case or substrate (not shown) with the heat dissipating contacts 5 securely attached, together with the beam leads 2, to a metallized pattern on the substrate the contacts 5 serve to dissipate the heat generated in the semiconductor pellet 1.

The cross sections given in FIGS. 2A—2F′ are steps of the fabrication process of the embodiment shown in FIG. 1.

First, as shown in FIG. 2A, all the components of the element are formed within the surface of the semiconductor material which has an insulating film 6 such as oxide or nitride film thereon. Next, as shown in FIG. 2B, conventional photoresist masking and insulator film etching process are employed to open contact windows 7 through the insulating film 6 which serve as an outlet electrode for the components. At the same time, another aperture 8 is formed at the portion where a heat-dissipating contact 5 is to be provided. After these apertures have been formed, ohmic contacts are formed and a metallic layer is formed thereon to provide a beam lead 2 and a heat-dissipating contact 5, as shown. If the semiconductor pellet 1 is silicon, an ohmic contact is formed of a platinum silicide layer 9, for example, as shown in FIG. 2C, and then, the layer 10 of active metal such as titanium which is highly adherent to the insulating film 6 is sandwiched between the platinum silicide layer 9 and a platinum layer 11, as shown in FIG. 2D. These layers are then selectively removed and the uppermost layer 12 of gold is formed. Thus, an electrode and contact are formed and the fabrication is completed.

The platinum layer 11 is provided to avoid permeation of the gold 12 into the underlayers. The height of each heat-dissipating contact 5 is the same as the thickest portion of the beam lead 2, and it may be matched to the supporting plane of the case or substrate on which the semiconductor pellet 1 is mounted. As shown in FIG. 2E, it is possible to heighten the plated layer 12′ by a dimension equal to the thickness of the metallized pattern 13 of the case or substrate so that the contact 5 may be attached to the surface of an insulator substrate 14 which has metallized pattern 13, as shown in FIG. 2F. Of course, the process for causing the accretion of the plated layer 12′ is intended to ensure a good adhesion of the heat-dissipating contact 5 to the supporter. If the metallized pattern 13 is embedded within the substrate, as shown in FIG. 2F′, there is no need of forming the added-plated layer 12′. From the semiconductor pellet 1 shown in FIG. 2F, the heat is dissipated not only through each beam lead 2 but also through each heat-dissipating contact 5, with a corresponding increase in the heat dissipation efficiency.

Since each beam lead element is attached, upside down, onto the substrate 14 as shown in FIG. 2F and F′, the substrate material must be formed of or must be coated with an insulating material lest the metallized electrode pattern formed in central region 3 of semiconductor pellet 1 be short circuited. For this reason, the insulating material of the substrate is urged against the semiconductor chip firmly as compared with ordinary planar elements, the backside of which are bonded to a metallic case. Therefore, the insulating material to be used is preferably one having a good thermal conductivity such s beryllia and alumina ceramics. Even with an insulating material of a poor thermal conductivity, heat dissipation is theoretically possible by an amount which is determined by the product of the ratio of thermal contact areas and the ratio of thermal conductivities of the substrate materials. Thus, in comparison with the conventional beam lead elements which solely rely upon the beam leads 2 for the heat dissipation, the element according to the invention has a remarkably improved heat dissipation efficiency.

If necessary, the heat-dissipating contacts 5 may also be formed as beam leads for connection with an external radiator 15 as shown in FIG. 2G. In this case, the heat dissipation efficiency depends only upon the ratio of thermal contact areas as compared with the conventional planar elements, and a higher degree of heat dissipation can be expected than in the case of FIG. 2F.

The present invention contributes materially to the improvement of heat-dissipation efficiency of elements having many heat-generating components such as the transistors for semiconductor integrated circuit elements and resistors, power transistors, rectifiers and the like which are constructed with the beam lead technique.

Further advantages of the present invention include the following. When the invention is applied to a semiconductor integrated circuit element, the portions of the semiconductor pellet 1 in FIG. 1, which is not related to electrical components of the circuit element and are free of beam leads 2 or, stated differently, only blank, waste portions, are utilized. Thus, as compared with conventional beam lead integrated circuit elements, the semiconductor pellet according to the invention needs not have as wide an area and hence the application of the present invention does not result in any deterioration in the yield from a semiconductor wafer.

While the present invention has been described as applied to a beam lead element, it should not be construed that the invention is in no way limited in application to the elements of beam lead type but is equally applicable to all of the semiconductor elements fabricated by the face bond technique.

We claim:

1. A face bond type semiconductor device having high heat dissipation efficiency comprising a semiconductor pellet including at least one circuit component in its central region surrounded by a peripheral region, said circuit component having a plurality of output electrodes on one major surface at said central region of said pellet, a plurality of first metallic film strips adherent to said one major surface at said peripheral region and extending to said central region to make electrical contact to said electrodes, a plurality of second metallic film strips spaced between said first metallic film strips and adherent to said one major surface at said peripheral region, said second metallic film strip being similar in physical structure to said first metallic film strips but not extending to said central region and being nonconnected to said electrodes; and an insulator substrate having a predetermined metallized pattern on one major plane for providing electrical connection for said outlet electrodes, thereby to firmly bond said pellet to said one major plane of said substrate in face to face fashion, with said second metallic film strips being kept firmly in contact with said substrate for facilitating heat dissipation from said peripheral pellet region to said substrate.

2. The semiconductor device claimed in claim 1, wherein said first metallic film strips are beam leads outwardly projecting in cantilever fashion from the edge of said pellet.